(12) United States Patent
Maier et al.

(10) Patent No.: US 10,866,407 B2
(45) Date of Patent: Dec. 15, 2020

(54) MICROMECHANICAL COMPONENT AND METHOD FOR PRODUCING A MICROMECHANICAL COMPONENT

(71) Applicant: Robert Bosch GmbH, Stuttgart (DE)

(72) Inventors: Daniel Maier, Stuttgart (DE); Joerg Muchow, Munich (DE); Corinna Koepernik, Reutlingen (DE); Helmut Grutzeck, Kusterdingen (DE); Rainer Straub, Ammerbuch (DE); Stefan Mark, Wuerzburg (DE); Thorsten Balslink, Kirchentellinsfurt (DE)

(73) Assignee: Robert Bosch GmbH, Stuttgart (DE)

( * ) Notice: Subject to any disclaimer, the term of this patent is extended or adjusted under 35 U.S.C. 154(b) by 192 days.

(21) Appl. No.: 16/190,333

(22) Filed: Nov. 14, 2018

(65) Prior Publication Data
US 2019/0146210 A1    May 16, 2019

(30) Foreign Application Priority Data
Nov. 16, 2017    (DE) .................. 10 2017 220 413

(51) Int. Cl.
*G02B 26/08*    (2006.01)
*B81B 3/00*    (2006.01)
*G02B 26/10*    (2006.01)

(52) U.S. Cl.
CPC ............ *G02B 26/0833* (2013.01); *B81B 3/00* (2013.01); *G02B 26/085* (2013.01); *G02B 26/105* (2013.01)

(58) Field of Classification Search
None
See application file for complete search history.

(56) References Cited

U.S. PATENT DOCUMENTS

2016/0105090 A1\*  4/2016  Sadaharu ........... G02B 26/0841
                                                            310/38

FOREIGN PATENT DOCUMENTS

DE    102015222300 A1    5/2017

\* cited by examiner

*Primary Examiner* — Jennifer D. Carruth
(74) *Attorney, Agent, or Firm* — Norton Rose Fulbright US LLP; Gerard Messina

(57) ABSTRACT

A micromechanical component includes a micromirror connected to a mounting support via at least one spring such that the micromirror is adjustable about at least one axis of rotation relative to the mounting support, where the micromirror includes a reflective surface developed at least partially on a first diaphragm surface of a mounted diaphragm of the micromirror, the diaphragm including a second diaphragm surface that faces away from the first diaphragm surface and that is mounted in air or vacuum.

11 Claims, 2 Drawing Sheets

MICROMECHANICAL COMPONENT AND METHOD FOR PRODUCING A MICROMECHANICAL COMPONENT

CROSS-REFERENCE TO RELATED APPLICATIONS

The present application claims priority under 35 U.S.C. § 119 to DE 10 2017 220 413.3, filed in the Federal Republic of Germany on Nov. 16, 2017, the content of which is hereby incorporated by reference herein in its entirety.

FIELD OF THE INVENTION

The present invention relates to a micromechanical component. In addition, the present invention relates to a method for producing a micromechanical component.

BACKGROUND

DE 10 2015 222 300 A1 describes micromechanical components and methods for producing micromechanical components. Each of these micromechanical components comprises a mounting support, a micromirror having a reflective surface, and at least one spring, the micromirror being connected to the mounting support via the at least one spring in such a way that the micromirror is adjustable about at least one axis of rotation in relating to the mounting support.

SUMMARY

According to an example embodiment of the present invention, a micromechanical component includes a micromirror that is adjustable about at least one axis of rotation and that has a comparatively small mass due to the construction of its reflective surface at least partially on a mounted diaphragm of the micromirror. As will be explained more precisely below, the comparatively small mass of the micromirror effects a reduction of an amplitude of undesired oscillations, which are triggered by (external) vibrations. Due to the reduction of the amplitude of the undesired oscillations, a micromechanical component according to an example embodiment of the present invention has a relatively high robustness against vibrations and/or a good shock resistance and/or fall resistance. Using the present invention, it is thus possible to produce micromechanical components that, due to their high vibration robustness and/or good shock and/or fall resistance, can be used reliably and unproblematically in application positions where there is a frequent occurrence of vibrations such as in a vehicle/motor vehicle, for example, and/or in application positions where there is a high risk of shock and/or falling.

The micromechanical components of the present invention can be used as components of sensors or actuators. A micromechanical component according to the present invention can be used for example in a projector/a projection system or in a scanning device/a scanner. The micromechanical component of the present invention is thus usable in manifold ways.

In an advantageous example embodiment of the micromechanical component, a total diaphragm thickness of the mounted diaphragm from the first diaphragm surface to the second diaphragm surface in a direction perpendicular to the reflective surface is smaller than or equal to 5 μm. For example, the total diaphragm thickness of the mounted diaphragm (from the first diaphragm surface to the second diaphragm surface) in a direction perpendicular to the reflective surface can be smaller than or equal to 2 μm, in particular smaller than or equal to 1 μm. The micromirror produced using the respective diaphragm thus has a comparatively low mass, which, as explained above, contributes to an advantageous increase in the vibration robustness and/or an improvement of the shock and/or fall resistance of the respective example embodiment of the micromechanical component.

In an advantageous example embodiment of the micromechanical component, the reflective surface is an outer surface of a platinum layer. Using the platinum layer, it is possible to apply a mechanical stress up to 30 bar to the respective diaphragm, which ensures a high robustness of the diaphragm.

For example, the mounted diaphragm includes a layer stack of at least one silicon oxide layer and at least one silicon nitride layer covering the at least one adjacent silicon oxide layer. Using this kind of a layer stack made up of silicon oxide and silicon nitride makes it possible to produce a mechanically stressed diaphragm even at a comparatively small total diaphragm thickness.

Preferably, a total layer thickness, in a direction perpendicular to the reflective surface, of the at least one silicon oxide layer is greater by a factor of 2 than a total layer thickness, in a direction perpendicular to the reflective surface, of the at least one silicon nitride layer. Silicon oxide has a mechanical stress of −300 MPa, while a mechanical stress of silicon nitride is 1000 MPa. By way of the ratio indicated here between the total layer thickness of the at least one silicon oxide layer and the total layer thickness of the at least one silicon nitride layer, a sum of the mechanical stresses results in an advantageous/positive internal stress of the mounted diaphragm. The mounted diaphragm is thus extremely robust. It is also possible, however, for the diaphragm to be made up of only one layer under tensile stress.

In an example embodiment, at least one conductor loop and/or coil, which can be supplied with current, is developed on the first diaphragm surface, on the second diaphragm surface, and/or in the diaphragm. By supplying current to the at least one conductor loop and/or coil, it is possible to set the micromirror into an oscillation about the at least one axis of rotation in an external magnetic field. It is thus possible to utilize the advantages of a magnetic actuator for this example embodiment of the micromechanical component.

Advantageously, the diaphragm can be mounted by at least one beam, at least one sub-frame structure, and/or by at least one frame structure. Alternatively, however, the diaphragm can be mounted exclusively by at least one tensile force exerted on it by the at least one spring and/or mounting support. A stability of the mounted diaphragm is thus easily ensured.

The advantages described above are also achieved in the implementation of a corresponding method for producing a micromechanical component. It is pointed out that the production method in accordance with the example embodiments of the micromechanical component explained above is capable of being developed further.

Additional features and advantages of the present invention are explained below with reference to the figures.

DETAILED DESCRIPTION

Figure 1A:
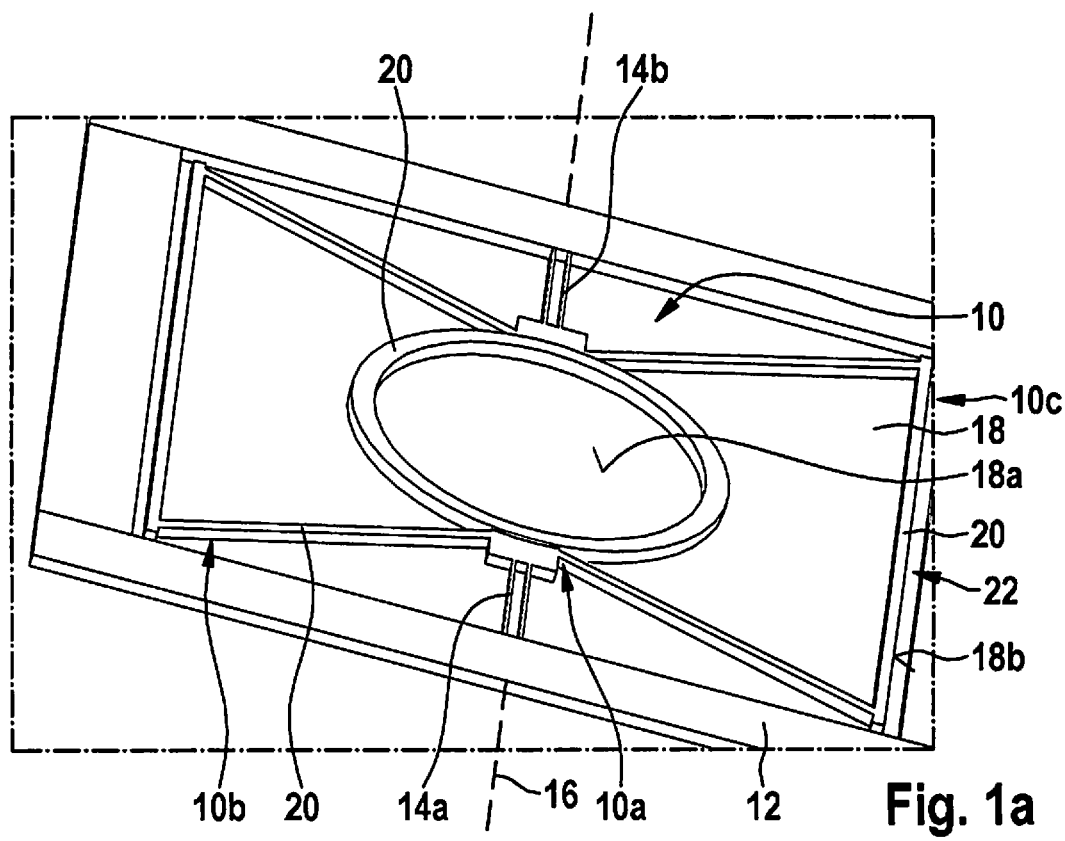
FIGS. 1a and 1b are, respectively, schematic whole and partial representations of a micromechanical component, according to an example embodiment of the present invention.
Figure 1B:
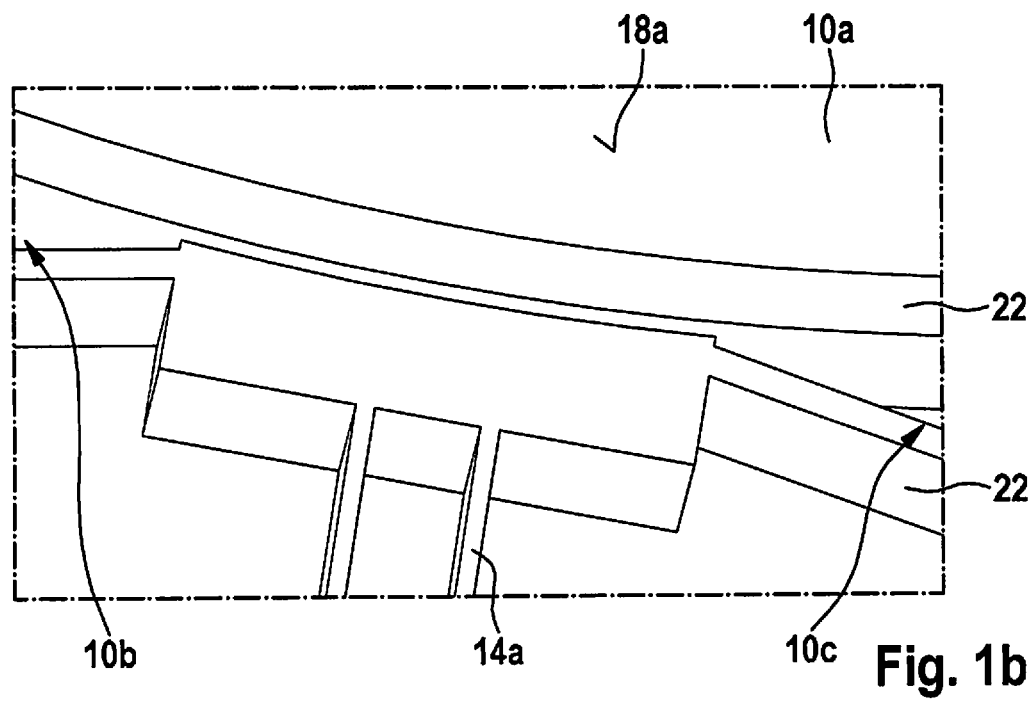

FIGS. 1a and 1b show schematic whole and partial representations of an example embodiment of a micromechanical component. The micromechanical component shown schematically in FIGS. 1a and 1b has a micromirror 10 developed as an oscillating element having a reflective surface (not drawn), which is developed by way of example in a central mirror area 10a of micromirror 10. The micromechanical component also includes a mounting support 12 and at least one spring 14a and 14b. Micromirror 10 is connected to mounting support 12 via at least the at least one spring 14a and 14b in such a way that micromirror 10 is adjustable about at least one axis of rotation 16 relative to mounting support 12. In the example embodiment of FIGS. 1a and 1b, micromirror 10 is adjustable relative to mounting support 12 merely about the (sole) axis of rotation 16. It is pointed out, however, that micromirror 10 can, in other embodiments, also (in addition to axis of rotation 16) be adjustable about a further axis of rotation oriented in an inclined/perpendicular manner with respect to axis of rotation 16. As a further refinement, it is also possible that a conductor track is laid across the at least one spring 14a and 14b.

The reflective surface is developed at least partially on a first diaphragm surface 18a of a mounted diaphragm 18 of micromirror 10. Mounted diaphragm 18 is developed on micromirror 10 in such a way that a second diaphragm surface 18b facing away from first diaphragm surface 18a is mounted in air or vacuum. (Diaphragm 18 used as "carrier of the reflective surface" is thus not to be understood as a covering layer.) If desired, the reflective surface can also be developed on both diaphragm surfaces 18a and 18b. It is also possible to use/develop either only a partial area of the respective diaphragm surface 18a or 18b or an entire area of the respective diaphragm surface 18a or 18b as a reflective surface. (Of course, it is also possible for the "back side" of FIG. 1a to be reflective as first diaphragm surface 18a, possibly together with the "front side" of FIG. 1a as second diaphragm surface 18b.)

Due to the development of the reflective surface at least partially on first diaphragm surface 18a of mounted diaphragm 18, micromirror 10 has a relatively low mass m in comparison with the related art. Reducing the mass m of micromirror 10 also results in a reduction of a moment of inertia I of micromirror 10 for its oscillatory motion about axis of rotation 16. (This applies respectively also in the case of a further axis of rotation oriented in an inclined/perpendicular manner with respect to axis of rotation 16.) For a natural frequency f of the oscillatory motion of micromirror 10 about axis of rotation 16, at a spring stiffness k of the at least one spring 14a and 14b, the following applies according to equation (Eq. 1):

$$f = \sqrt{\frac{k}{I}} \quad \text{(Eq. 1)}$$

Natural frequency f of the oscillatory motion of micromirror 10 about axis of rotation 16 can thus be increased by designing micromirror 10 with mounted diaphragm 18 as "carrier of the reflective surface," without having to increase spring stiffness k of the at least one spring 14a and 14b. Natural frequency f of the oscillation of micromirror 10 about axis of rotation 16 can be at least at 1 kHz (kilohertz), for example. (This applies respectively also to the further axis of rotation oriented in an inclined/perpendicular manner with respect to axis of rotation 16.)

Furthermore, for a maximum deflection Θ of the oscillatory motion of micromirror 10 about axis of rotation 16 effected by a moment of rotation M (and accordingly in the case of the further axis of rotation oriented in inclined/perpendicular fashion with respect to axis of rotation 16), the following applies according to equation (Eq. 2):

$$\Theta = \frac{M}{k} \quad \text{(Eq. 2)}$$

At a low spring stiffness k of the at least one spring 14a and 14b, it is thus not necessary to generate a high moment of rotation M in order to bring about a comparatively high maximum deflection Θ of the oscillatory motion of micromirror 10 (e.g., of at least 0.4 µm) about axis of rotation 16 (and accordingly about the further axis of rotation). A low spring stiffness k of the at least one spring 14a and 14b therefore has a positive effect on a power consumption of the micromechanical component for exciting the oscillatory motion of micromirror 10 about axis of rotation 16 (and/or the further axis of rotation).

Sometimes at least, vibrations transmitted to the micromechanical component or a shock of the micromechanical component can cause an (undesired) spurious oscillation of micromirror 10 at an acceleration a. (The spurious oscillation of micromirror 10 is not to be understood as an oscillatory motion of micromirror 10 about the at least one axis of rotation 16.) For an amplitude u of the spurious oscillation, the following applies according to equation (Eq. 3)

$$u = \frac{a * Q}{(2\pi f)^2}, \quad \text{(Eq. 3)}$$

where Q is a quality factor (or a quality). According to equation (Eq. 4), the quality factor is defined for oscillatory motions by:

$$Q = \frac{\sqrt{m*k}}{d}, \quad \text{(Eq. 4)}$$

where d is a damping constant of the respective oscillatory motion. By way of equations (Eq. 1) and (Eq. 4), one thus obtains for amplitude u of the spurious oscillation equation (Eq. 5):

$$u = \frac{a}{(2\pi)^2 * d} * \frac{m^{1.5}}{k^{0.5}} \quad \text{(Eq. 5)}$$

The reduction of the mass m of micromirror 10 achieved by developing micromirror 10 with mounted diaphragm 18 as "carrier of the reflective surface" thereby also triggers a reduction of the amplitude u of the spurious oscillation of micromirror 10. One can also describe this as a "targeted damping" of the spurious oscillation without impairment of the (desired) oscillatory motion of micromirror 10 about its at least one axis of rotation 16. The reduction of mass m of micromirror 10 (by developing mounted diaphragm 18 as "carrier of the reflective surface") thus suppresses the undesired spurious oscillation, increases a vibration resistance of the micromechanical component, and increases a fall resistance of the micromechanical component. In particular, by reducing the mass m of micromirror 10 (by using diaphragm 18 as "carrier of the reflective surface"), it is possible to prevent the micromirror 10 set into spurious oscillation from striking against mounting support 12 (or another neighboring component of the micromechanical component) even when the micromechanical component is vibrating greatly or when the micromechanical component falls down. The function performed by the micromechanical component (e.g., in a sensor or in an actuator) is thus not/hardly impaired/disrupted even in such a situation. The micromechanical component can therefore also be used advantageously in environments in which vibrations occur frequently or in which a risk of shock or fall for the micromechanical component is high, such as for example in a vehicle/motor vehicle.

Preferably, a total diaphragm thickness of the mounted diaphragm 18, from the first diaphragm surface 18a to the second diaphragm surface 18b, in a direction perpendicular to the reflective surface is smaller than or equal to 5 μm (micrometer), for example smaller than or equal to 2 μm (micrometer), in particular smaller than or equal to 1 μm (micrometer). By way of such a low total diaphragm thickness of mounted diaphragm 18, it is possible to achieve a relatively low mass m of micromirror 10.

Diaphragm 18 can be made of at least one metal, semiconductor material, and/or electrically insulating material. The mounted diaphragm 18 is made for example of a semiconductor material such as in particular silicon, a layer thickness of the semiconductor material being reduced by etching (at least in places) so that the desired total diaphragm thickness is achieved. Advantageous materials for mounted diaphragm 18 are also silicon oxide and/or silicon nitride. (The nitride used can be a plasma nitride or an LP nitride.) In an advantageous example embodiment, mounted diaphragm 18 includes a layer stack of at least one silicon oxide layer and at least one silicon nitride layer covering the at least one adjacent silicon oxide layer. For example, the layer stack can have at least two alternating silicon oxide and silicon nitride layers. In an alternative example embodiment, however, the layer stack has only one single silicon oxide layer and one single silicon nitride layer. The joint usage of silicon oxide and silicon nitride for the mounted diaphragm 18 is advantageous since silicon oxide having a mechanical stress of −300 MPa and silicon nitride having a mechanical stress of 1000 MPa are well suited for "setting" a desired internal stress of mounted diaphragm 18.

Preferably, a total layer thickness, in a direction perpendicular to the reflective surface, of the at least one silicon oxide layer is greater by a factor of at least 2, e.g., by a factor of at least 2.3, in particular by a factor of at least 2.5, than a total layer thickness, in a direction perpendicular to the reflective surface, of the at least one silicon nitride layer. In this manner, it is possible to design the mounted diaphragm to have a positive internal stress, without the risk of an undesired warping of diaphragm 18 (due to its excessively high internal stress). Diaphragm 18 preferably has an internal stress between 50 MPa (megapascal) and 100 MPa (megapascal).

The reflective surface can be for example an outer surface of a metal and/or semiconductor layer. When mounted diaphragm 18 is developed at least partially or entirely from a semiconductor material such as silicon for example, an etched area, a polished area or an untreated area of the semiconductor material/silicon can be used as the reflective surface. A reflectivity of the reflective surface can optionally also be increased by doping. It is also possible to use at least one gold layer, aluminum layer, platinum layer, and or λ/4 layer of diaphragm 18 for the reflective surface. (A plastic deformation of the reflective surface is easily preventable by way of a suitable definition of the internal stress of diaphragm 18.) In particular, an outer surface of a platinum layer is advantageous as a reflective surface since by way of the platinum layer it is easy to apply a mechanical stress of 30 bar to mounted diaphragm 18, which increases a robustness of mounted diaphragm 18.

In the example embodiment of FIGS. 1a and 1b, diaphragm 18 is mounted using at least one beam 20, or using at least one sub-frame structure, and/or frame structure 22. The at least one beam 20, or the at least one sub-frame structure, and/or frame structure 22, can have an extension, in a direction perpendicular to the reflective surface, greater than the total diaphragm thickness of mounted diaphragm 18. Preferably the maximum extension (in a direction perpendicular to the reflective surface) of the at least one beam 20, or of the at least one sub-frame, and/or frame structure 22, is smaller than or equal to 50 μm (micrometer), preferably smaller than or equal to 30 μm (micrometer), in particular smaller than or equal to 20 μm (micrometer). The mass m of micromirror 10 is thus barely increased by developing the at least one beam 20, or the at least one sub-frame, and/or frame structure 22. Only by way of example does micromirror 10 of FIGS. 1a and 1b have an inner sub-frame structure and/or frame structure 22 and an outer sub-frame structure and/or frame structure 22 framing the inner sub-frame structure and/or frame structure for mounting diaphragm 18. Alternatively, diaphragm 18 can also be mounted exclusively, e.g., by at least one tensile force exerted on it by the at least one spring 14a and 14b and/or mounting support 12.

In an example embodiment, at least one conductor loop and/or coil, which can be supplied with current, is/are developed on the first diaphragm surface 18a, on the second diaphragm surface 18b, and/or in diaphragm 18. (It is possible reliably to prevent a plastic deformation of the at least one conductor loop and/or coil, which is/are capable of being supplied with current, by a suitable definition of the internal stress of diaphragm 18.) In the example embodiment of FIGS. 1a and 1b, on each side of axis of rotation 16, micromirror 10 has respectively one coil brace area 10b and 10c (connected on central mirror area 10a), respectively at least one conductor loop and/or coil, which is/are capable of being supplied with current, being developed on each coil brace area 10b and 10c. Due to the relatively great distance of each coil brace area 10b and 10c from axis of rotation 16, by supplying the conductor loops and/or coils with current, it is possible to achieve comparatively high torques in a constant magnetic field or one that varies over time (not shown in FIGS. 1a and 1b). (Measurements have shown for example that supplying the conductor loops and/or coils with a current intensity of 50 mA suffices for exciting the desired oscillatory motion of micromirror 10 about axis of rotation 16.) Micromirror 10 is thus advantageously suitable for interacting with the respective magnetic field.

For example, the micromechanical component of FIGS. 1a and 1b has, as its at least one spring 14a and 14b, two springs 14a and 14b, between which diaphragm 18 is mounted. FIG. 1b shows a contact point/anchoring area of one of springs 14a and 14b on micromirror 10 in an enlarged partial representation. Each of springs 14a and 14b is by way of example a bar spring 14a and 14b, which extends along the axis of rotation 16. The respective bar springs 14a and 14b in particular can have a U-shaped cross section perpendicular to axis of rotation 16 in that the respective bar springs 14a and 14b each includes two bars and a diaphragm mounted between the two bars. A spring shape of this type is stress-optimized.

The spring shape of springs 14a and 14b shown in FIGS. 1a and 1b, however, is only to be interpreted by way of example.

It is pointed out once more that due to the comparatively low mass m of micromirror 10, the micromechanical component of FIGS. 1a and 1b has a high vibration resistance, a high fall resistance, a high natural frequency f, and at the same time a low power consumption. The micromechanical component of FIGS. 1a and 1b can be used for example for an automatic lidar, for a highway pilot, or for UAD (urban assisted driving).

Figure 2:
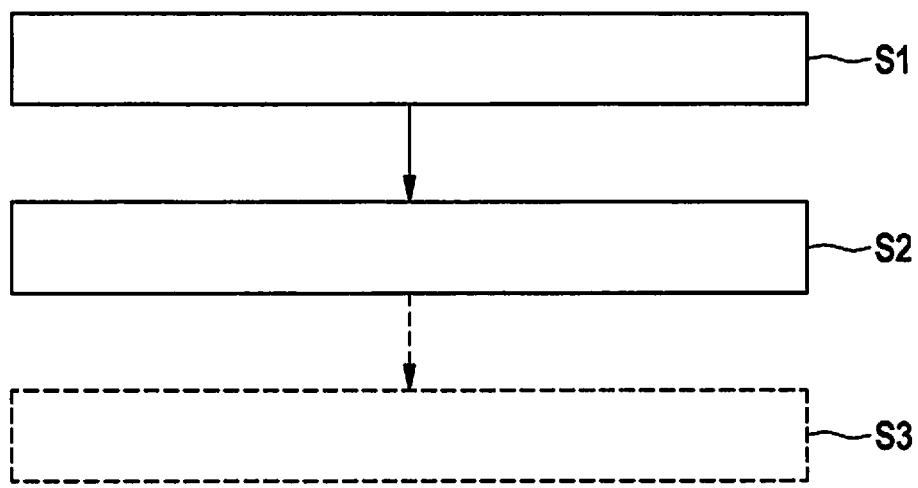
FIG. 2 is a flowchart that illustrates a method of producing a micromechanical component, according to an example embodiment of the present invention.

FIG. 2 is a flowchart for explaining an example embodiment of a production method of a micromechanical component. The production method described below creates all of the above-mentioned advantages. A repeated itemization of the advantages is therefore omitted.

In a method step S1 of the production method, a micromirror having a reflective surface is mounted via at least one spring on a mounting support in such a way that the micromirror is adjustable about at least one axis of rotation relative to the mounting support. The production method furthermore includes a method step S2, in which the micromirror is developed having a mounted diaphragm, the reflective surface being developed at least partially on a first diaphragm surface of the diaphragm, which faces away from a second diaphragm surface that is mounted in air or vacuum. Method step S2 can be performed before or after method step S1 or in temporally overlapping/simultaneous fashion with method step S1. For example, at least one portion of the micromirror, the at least one spring, and at least one portion of the mounting support are simultaneously structured and/or exposed from at least one semiconductor material.

At least as part of the micromirror, it is also possible to form a layer stack from at least one silicon oxide layer and at least one silicon nitride layer. The layer stack made of the at least one silicon oxide layer and the at least one silicon nitride layer is easy to produce since these layers can be formed using simple deposition methods on a semiconductor layer such as a silicon layer, for example. Afterwards, the semiconductor material/silicon can be etched/removed selectively from the silicon oxide, whereby the mounted diaphragm is exposed.

As an optional development, the production method can also include a method step S3, in which at least one conductor loop and/or coil, which is capable of being supplied with current, is developed on the first diaphragm surface, on the second diaphragm surface and/or in the diaphragm.

What is claimed is:

1. A micromechanical component comprising:
    a mounting support;
    a micromirror that includes a mounted diaphragm including a first diaphragm surface, which is reflective, and a second diaphragm surface that faces away from the first diaphragm surface and is mounted in air or in a vacuum; and
    at least one spring via which the micromirror is connected to the mounting support such that the micromirror is adjustable relative to the mounting support about at least one axis of rotation,
    wherein a total diaphragm thickness of the mounted diaphragm, from the first diaphragm surface to the second diaphragm surface in a direction perpendicular to the reflective surface, is smaller than or equal to 5 µm.

2. The micromechanical component of claim 1, wherein the reflective surface is an outer surface of a platinum layer.

3. The micromechanical component of claim 1, wherein the mounted diaphragm includes a layer stack of at least one silicon oxide layer and at least one silicon nitride layer covering the at least one adjacent silicon oxide layer.

4. The micromechanical component of claim 3, wherein a total layer thickness, in a direction perpendicular to the reflective surface, of the at least one silicon oxide layer is greater by a factor of at least 2 than a total layer thickness, in the direction perpendicular to the reflective surface, of the at least one silicon nitride layer.

5. The micromechanical component of claim 1, further comprising, on or in the diaphragm, one or both of (a) a conductor loop that is suppliable with current and (b) a coil that is suppliable with current.

6. The micromechanical component of claim 1, wherein the diaphragm is mounted by at least one beam.

7. The micromechanical component of claim 1, wherein the diaphragm is mounted by at least one sub-frame structure.

8. The micromechanical component of claim 1, wherein the diaphragm is mounted by at least one frame structure.

9. The micromechanical component of claim 1, wherein the diaphragm is mounted exclusively by at least one tensile force exerted on it by one or both of (a) the at least one spring and (b) the mounting support.

10. A method for producing a micromechanical component, the method comprising:
    mounting a micromirror on a mounting support via at least one spring, such that the micromirror is adjustable relative to the mounting support about at least one axis of rotation, wherein the micromirror includes a mounted diaphragm including a first diaphragm surface, which is reflective, and a second diaphragm surface that faces away from the first diaphragm surface and is mounted in air or in a vacuum,
    wherein a total diaphragm thickness of the mounted diaphragm, from the first diaphragm surface to the second diaphragm surface in a direction perpendicular to the reflective surface, is smaller than or equal to 5 µm.

11. The production method of claim 10, wherein the micromirror includes, on or in the diaphragm, one or both of (a) a conductor loop that is suppliable with current and (b) a coil that is suppliable with current.

* * * * *